US012665512B2

(12) United States Patent
Liu et al.

(10) Patent No.: US 12,665,512 B2
(45) Date of Patent: Jun. 23, 2026

(54) ULTRA-LOW QUIESCENT CURRENT BUCK CONVERTER WITH SWITCHABLE COMPARATOR

(71) Applicant: RICHTEK TECHNOLOGY CORP., Hsinchu County (TW)

(72) Inventors: Yu-Hsuan Liu, New Taipei City (TW); Yung-Chun Chuang, Taipei City (TW)

(73) Assignee: RICHTEK TECHNOLOGY CORP., Hsinchu County (TW)

( * ) Notice: Subject to any disclaimer, the term of this patent is extended or adjusted under 35 U.S.C. 154(b) by 155 days.

(21) Appl. No.: 18/888,123

(22) Filed: Sep. 17, 2024

(65) Prior Publication Data

US 2026/0081525 A1 Mar. 19, 2026

(51) Int. Cl.
| | |
|---|---|
| *H02M 3/158* | (2006.01) |
| *H02M 1/00* | (2007.01) |
| *H02M 3/156* | (2006.01) |
| *H03K 19/173* | (2006.01) |

(52) U.S. Cl.
CPC ......... *H02M 3/158* (2013.01); *H02M 1/0025* (2021.05); *H02M 1/0032* (2021.05); *H03K 19/1733* (2013.01); *H02M 3/156* (2013.01)

(58) Field of Classification Search
CPC ..... H02M 1/0025; H02M 3/156; H02M 3/158
See application file for complete search history.

(56) References Cited

U.S. PATENT DOCUMENTS

| | | | | |
|---|---|---|---|---|
| 9,806,617 | B1 * | 10/2017 | Ozawa | H02M 3/1588 |
| 11,218,076 | B2 * | 1/2022 | Priego | H02M 3/158 |
| 11,329,562 | B1 * | 5/2022 | Hsu | G01R 19/16538 |
| 11,362,579 | B2 * | 6/2022 | Hrinya | H02M 1/08 |
| 2014/0145679 | A1 | 5/2014 | Chen | |
| 2017/0201174 | A1 * | 7/2017 | Li | H02M 1/08 |
| 2020/0127569 | A1 | 4/2020 | Priego | |
| 2023/0127211 | A1 * | 4/2023 | Chen | H02M 3/158 |
| | | | | 323/259 |

FOREIGN PATENT DOCUMENTS

| | | |
|---|---|---|
| CN | 107659151 A | 2/2018 |
| WO | 2016/182206 A2 | 11/2016 |

* cited by examiner

*Primary Examiner* — Gary A Nash
(74) *Attorney, Agent, or Firm* — Winston Hsu

(57) ABSTRACT

A buck converter includes a power stage, a feedback network coupled to the power stage, a control loop, a logic circuit coupled to the control loop, a driver circuit coupled between the logic circuit and the power stage, and a load detection circuit. The power stage includes an input terminal for receiving an input voltage, and an output terminal for outputting an output voltage. The feedback network is used to generate a feedback voltage according to the output voltage. The control loop includes an error amplifier (EA) and a comparator coupled to the error amplifier. The error amplifier is used to generate an EA voltage by comparing a reference voltage to the feedback voltage. The comparator coupled to the error amplifier, is used to generate a CMP signal according the EA voltage.

20 Claims, 10 Drawing Sheets

S802

Disable switching operations
of the switches

S804

Clamp on an output of the error
amplifier

S806

Deactivate the comparator when a quiescent
current of the comparator reduces an
efficiency of the buck converter by greater
than or equal to a predetermined value

900

S902

Generate the reset signal by the load detector

S904

Reactivate the comparator in response to the reset signal

S906

Remove clamping on the output of the error amplifier

S908

Enable the switching operations of the switches

ULTRA-LOW QUIESCENT CURRENT BUCK CONVERTER WITH SWITCHABLE COMPARATOR

BACKGROUND OF THE INVENTION

1. Field of the Invention

The present invention relates to buck converters, and more particularly to ultra-low quiescent current buck converters.

2. Description of the Prior Art

The proliferation of portable electronic devices has led to an increasing demand for more efficient power management solutions. A critical component in these devices is the DC-DC buck converter, which plays a vital role in regulating voltage and managing power consumption. As devices spend significant periods in standby or sleep modes to conserve battery life, the quiescent current (IQ) of the buck converter becomes a crucial factor in determining overall energy efficiency.

Currently available low-power buck converters typically exhibit quiescent currents ranging from 500 nA to 10 µA. While these figures represent significant improvements over earlier generations, they still contribute substantially to battery drain during extended standby periods. For instance, in a device with a 2000 mAh battery capacity, a buck converter drawing 1 µA of quiescent current can significantly impact the standby time. As consumer expectations for longer battery life continue to grow, there is a pressing need for buck converters that can operate with even lower quiescent currents, ideally in the nanoampere (nA) range.

Conventional buck converters typically operate in two main modes: a normal mode for active operation and a power-saving mode for light load conditions. Some advanced designs incorporate a third mode for extremely light loads. However, these traditional approaches often struggle to maintain high efficiency across the entire spectrum of load conditions, particularly at very light loads where quiescent current becomes a dominant factor in power consumption.

Existing solutions, such as those described in US 2020/0127569 A1, have attempted to address this challenge by implementing deep power-save modes when the output load falls below a preset threshold. However, these approaches often come with significant trade-offs. In deep power-save mode, where only the comparator remains active, the converter can suffer from slower transient response. This can lead to larger voltage dropouts under certain conditions, potentially compromising the stability of the powered circuits. Moreover, the practice of switching between the error amplifier and comparator can introduce a host of issues, including offset errors, kickback noise, and overall stability problems, which can degrade the converter's performance and reliability.

Another limitation of conventional buck converters is their inability to dynamically adapt power consumption across a wide range of load conditions. Most converters are optimized for specific load ranges, resulting in suboptimal efficiency at very light loads or during rapid load transitions. This lack of adaptability becomes particularly problematic in modern devices that frequently switch between high-performance active modes and ultra-low-power sleep modes.

Furthermore, the design of ultra-low quiescent current converters presents significant technical challenges. Reducing the quiescent current often involves trade-offs in other performance aspects such as load regulation, line regulation, and transient response. Balancing these competing requirements while pushing the boundaries of low power consumption requires innovative circuit topologies and control strategies.

There is a clear need for an advanced DC-DC buck converter that can achieve ultra-low quiescent current operation, ideally in the range of 50 nA or less, while maintaining excellent transient response and stability across various load conditions. Such a converter should be capable of extending battery life significantly in portable electronic devices without compromising performance during active periods. Additionally, these converters must be capable of seamlessly transitioning between multiple power-saving modes to accommodate the dynamic power requirements of modern electronics.

SUMMARY OF THE INVENTION

An embodiment discloses a buck converter. The buck converter includes a power stage, a feedback network coupled to the power stage, a control loop, a logic circuit coupled to the control loop, a driver circuit coupled between the logic circuit and the power stage, and a load detection circuit. The power stage includes an input terminal for receiving an input voltage, and an output terminal for outputting an output voltage. The feedback network is used to generate a feedback voltage according to the output voltage. The control loop includes an error amplifier and a comparator coupled to the error amplifier. The error amplifier is used to generate an EA voltage by comparing a reference voltage to the feedback voltage. The comparator (CMP) is used to generate a CMP signal according the EA voltage. The logic circuit is used to generate a logic control signal for implementing a control scheme according to a set of control signals. The driver circuit is used to drive the power stage according to the logic control signal. The load detection circuit is used to provide a subset of control signals within the set of control signals to the logic circuit for mode switching in the control scheme according to an output current.

An embodiment discloses a method of operating a buck converter. The method includes operating the buck converter with clamping on an output of an error amplifier, and deactivating the comparator of the buck converter when the quiescent current reduces an efficiency of the buck converter by approximately greater than or equal to 1 percent. The output of the error amplifier is coupled to the comparator.

These and other objectives of the present invention will no doubt become obvious to those of ordinary skill in the art after reading the following detailed description of the preferred embodiment that is illustrated in the various figures and drawings.

DETAILED DESCRIPTION

The present disclosure provides a detailed description of various embodiments. While specific implementation details are presented herein to facilitate a comprehensive understanding of the disclosure, it will be apparent to those skilled in the art that the present invention may be realized without necessarily adhering to all such particularities. In certain instances, well-established methods, procedures, components, and circuits have been omitted from exhaustive description to avoid unnecessarily obfuscating the present disclosure. It should be understood that technical features individually described in relation to a single drawing may be implemented either discretely or in combination with other features, as set forth in the present specification.

Figure 1:
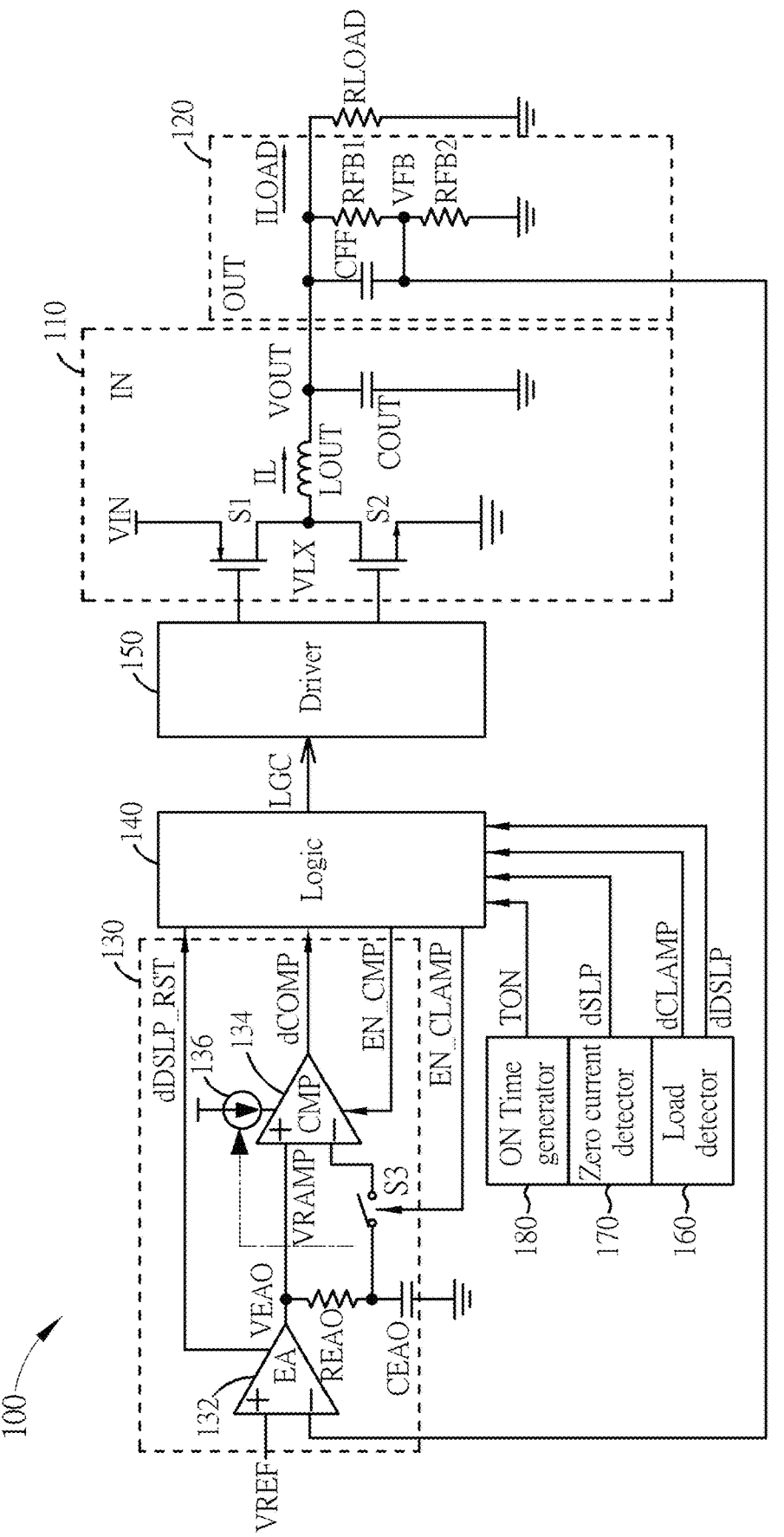
FIG. 1 depicts an embodiment of a buck converter.

FIG. 1 depicts an embodiment of a buck converter 100 with several key components. Specifically, the buck converter 100 includes a power stage 110, a feedback network 120 coupled to the power stage 110, a control loop 130, a logic circuit 140 coupled to the control loop 130, a driver circuit 150 coupled between the logic circuit 140 and the power stage 110, and a load detection circuit 160. The buck converter 100 may further incorporate additional components, including a zero current detector 170 and an on-time generator 180, both operatively coupled to the logic circuit 140.

The power stage 110 includes an input terminal IN for receiving an input voltage VIN, and an output terminal OUT for outputting an output voltage VOUT. The feedback network 120 generates a feedback voltage VFB based on the output voltage VOUT. The control loop 130 consists of an error amplifier (EA) 132 and a comparator (CMP) 134. The error amplifier 132 generates an EA voltage VEAO by comparing a reference voltage VREF to the feedback voltage VFB, while the comparator 134 produces a CMP signal dCOMP according to the EA voltage VEAO.

The logic circuit 140 is central to the converter's operation, generating a logic control signal LGC to implement the control scheme (i.e., normal, standby, sleep, and deep-sleep modes) based on various control signals. The driver circuit 150 then drives the power stage 110 according to this logic control signal LGC. Supporting these main components is the load detection circuit 160, which provides control signals dCLAMP and dDSLP to the logic circuit 140 for mode switching based on the detected output current IL in the power stage 110. Additionally, the zero current detector 170 generates a signal dSLP associated with sleep mode activation, while the on-time generator 180 produces a signal TON to control the duration of each switching cycle.

The power stage 110 further includes a first switch S1 (high-side switch) and a second switch S2 (low-side switch) coupled in series forming a half bridge configuration between the input terminal IN and the ground. An output inductor LOUT can be coupled between a switching node of the first switch S1 and the second switch S2 and the output terminal OUT. An output capacitor COUT can be coupled between the output terminal OUT and the ground. Furthermore, the first switch S1 can include a first terminal coupled to the input terminal IN, a second terminal coupled to the switching node, and a control terminal coupled to the driver circuit 150. Similarly, the second switch S2 can include a first terminal coupled to the switching node a second terminal coupled to the ground, and a control terminal coupled to the driver circuit 150.

The feedback network 120 is designed with a resistive divider, coupled between the output terminal OUT and ground, and incorporates a feed forward capacitor CFF coupled to the output terminal OUT, the resistive divider, and the error amplifier 132. The resistive divider consists of two resistors RFB1 and RFB2, connected in series. The feedback voltage VFB is sensed at the junction between these two resistors RFB1 and RFB2.

The control loop 130 incorporates additional components to enhance its functionality and enable the control scheme. A resistor-capacitor (RC) circuit can be coupled between the error amplifier 132 and ground, providing necessary compensation and stability. The RC circuit is formed by a resistor REAO and a capacitor CEAO coupled in series. Furthermore, a current source 136 is coupled to the comparator 134, ensuring proper biasing. A clamp switch S3 includes a first terminal coupled to the RC circuit, a second terminal connected to the comparator 134, and a control terminal linked to the logic circuit 140. This clamp switch S3 plays a vital role in implementing the various power-saving modes.

The error amplifier 132 can be configured with a non-inverting terminal that receives the reference voltage VREF, an inverting terminal coupled to the feedback network 120, a first output terminal, and a second output terminal coupled to the logic circuit 140. This dual-output configuration allows the error amplifier 132 to perform both normal regulation and sleep mode wake-up functions. The comparator 134 is designed with a non-inverting terminal connected to the first output terminal of the error amplifier 132, an inverting terminal coupled to the second terminal of the clamp switch S3, a power terminal coupled to the current source 136, a signal terminal coupled to the logic circuit 140, and an output terminal also coupled to the logic circuit 140. This arrangement enables the comparator 134 to generate the CMP signal dCOMP while allowing the logic circuit 140 to control its power state, crucial for achieving ultra-low quiescent current in deep-sleep mode. It should be noted that signal EN CMP is used to control the activation state of the comparator 134, and signal EN CLAMP is used to activate the clamping mechanism on the error amplifier output voltage VEAO.

The load RLOAD represents an electrical load connected to the output terminal OUT of the buck converter 100, which draws a load current ILOAD. The magnitude of the load current ILOAD is a critical parameter that determines the operating mode of the converter within the control scheme. As the load current ILOAD varies, the load detection circuit 160 monitors these changes, enabling the logic circuit 140 to dynamically switch operating modes to optimize efficiency.

The control scheme, comprising normal, standby, sleep, and deep-sleep modes, allows the buck converter 100 to precisely adapt its functionality to varying load demands while minimizing power consumption. This approach sophisticated enables seamless transitions between high-performance operation and ultra-low quiescent current states. In normal mode, the converter operates at full capacity, ensuring optimal voltage regulation and transient response. As the load decreases, it progresses through standby and sleep modes, gradually reducing power consumption by selectively disabling circuit components and adjusting control loop parameters. In deep-sleep mode, the buck converter 100 achieves unprecedented low quiescent current by completely shutting down the comparator 134, pushing the boundaries of power efficiency in battery-powered applications. This adaptive control strategy maintains high efficiency across a broad spectrum of load conditions, significantly extending battery life in portable electronic devices without compromising performance during active periods. The detailed operation will be described in later paragraphs.

The normal mode of operation in the buck converter 100 represents the primary functional state where the device actively regulates the output voltage VOUT under typical load conditions. During this mode, the buck converter 100 operates at its designed switching frequency, with both the first switch S1 and second switch S2 actively switching to maintain the desired output voltage VOUT. The control loop 130, comprising the error amplifier 132 and comparator 134, remains fully operational, continuously monitoring the feedback voltage VFB and adjusting the CMP signal dCOMP to ensure precise regulation. In normal mode, the inductor current IL flows continuously through the inductor LOUT, alternating between positive and negative slopes as switches S1 and S2 change states, enabling the buck converter 100 to manage the full spectrum of expected load currents ILOAD up to its maximum rated output. All circuit blocks, including the error amplifier 132, comparator 134, logic circuit 140, and driver circuit 150, are fully powered and active, resulting in the highest quiescent current among all operating modes.

This complete activation of all components allows the buck converter 100 to deliver optimal transient response and regulation performance, ensuring stable output voltage VOUT even under fluctuating load current ILOAD conditions. The converter 100 maintains this normal mode of operation as long as the load current ILOAD remains above the threshold that would initiate a transition to standby mode, specifically while the inductor current IL does not become negative during regular switching cycles. While this mode provides superior voltage regulation and transient response for typical operating conditions, it does so at the expense of higher power consumption compared to the more energy-efficient power-saving modes (standby, sleep, and deep-sleep) that the buck converter 100 can enter under lighter load conditions, as determined by the load detection circuit 160 and implemented by the logic circuit 140 in response to variations in the load current ILOAD.

The buck converter 100 enters standby mode when the load current ILOAD decreases to a point where the inductor current IL becomes negative during normal operation. Specifically, the transition to standby mode occurs when the inductor current IL falls below OA while the converter is operating in normal mode. This condition indicates that the energy stored in the inductor LOUT exceeds the current demand of the load RLOAD. Upon detecting this condition, the logic circuit 140, based on signals from the load detection circuit 160 and potentially the zero current detector 170, initiates the transition to standby mode. In standby mode, the logic circuit 140 instructs the driver circuit 150 to turn off both the first switch S1 and the second switch S2, halting the active switching process. This action prevents unnecessary power transfer and reduces switching losses. The error amplifier 132 and other control circuitry remain operational but may enter a lower power state. The buck converter 100 maintains the output voltage VOUT using the energy stored in the output capacitor COUT. Standby mode serves as an intermediate power-saving state, allowing the converter to quickly resume normal operation if the load current ILOAD increases, while still reducing power consumption during light load conditions. The converter remains in standby mode until either the load current ILOAD increases sufficiently to require active regulation, or it decreases further, potentially triggering a transition to sleep mode. During the sleep mode, the current generated by the current source 136 can be reduced from μA to nA level.

Figure 2A:
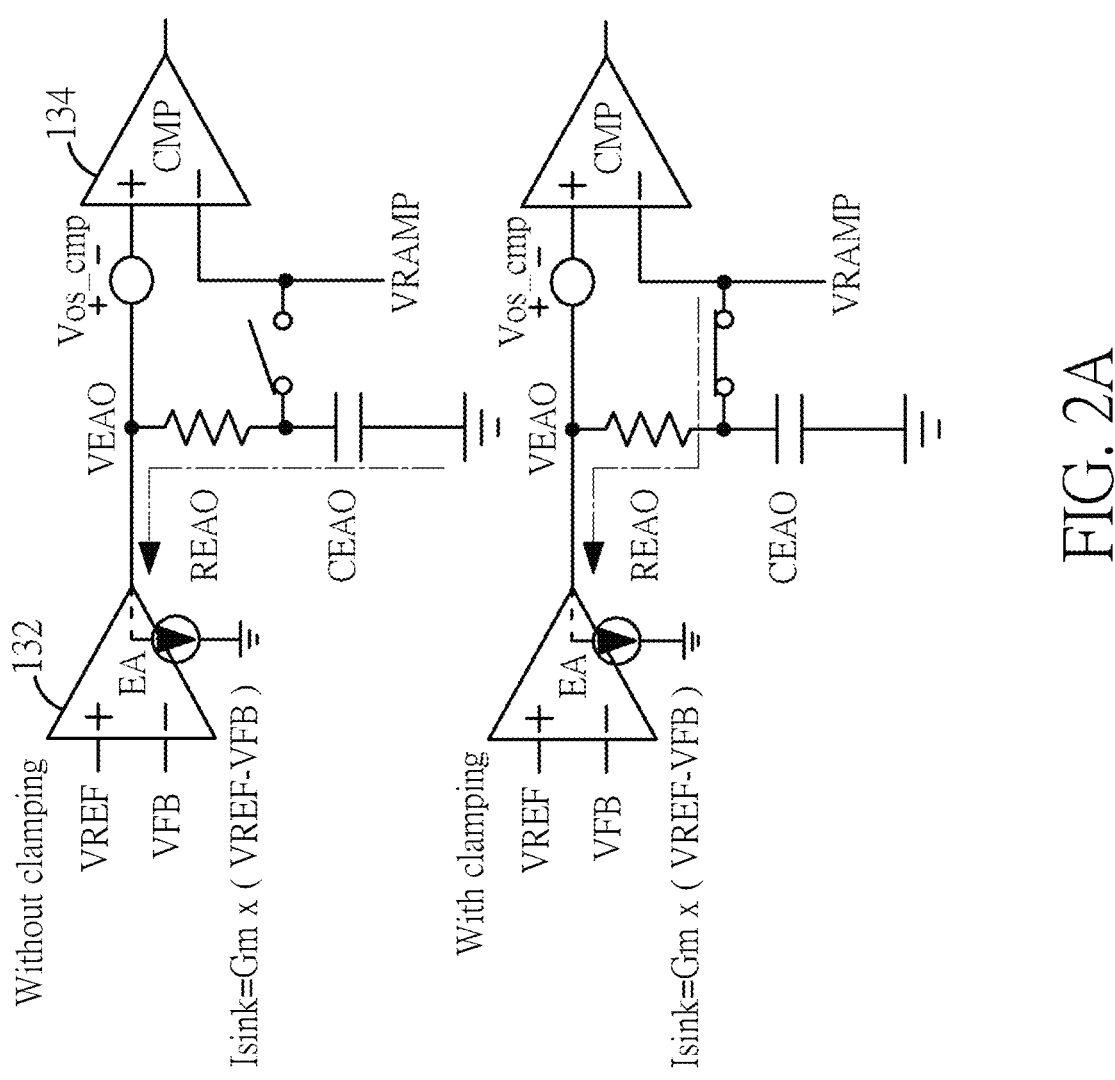
FIGS. 2A to 2B depict a transition from standby mode to sleep mode in the buck converter of FIG. 1.
Figure 2B:
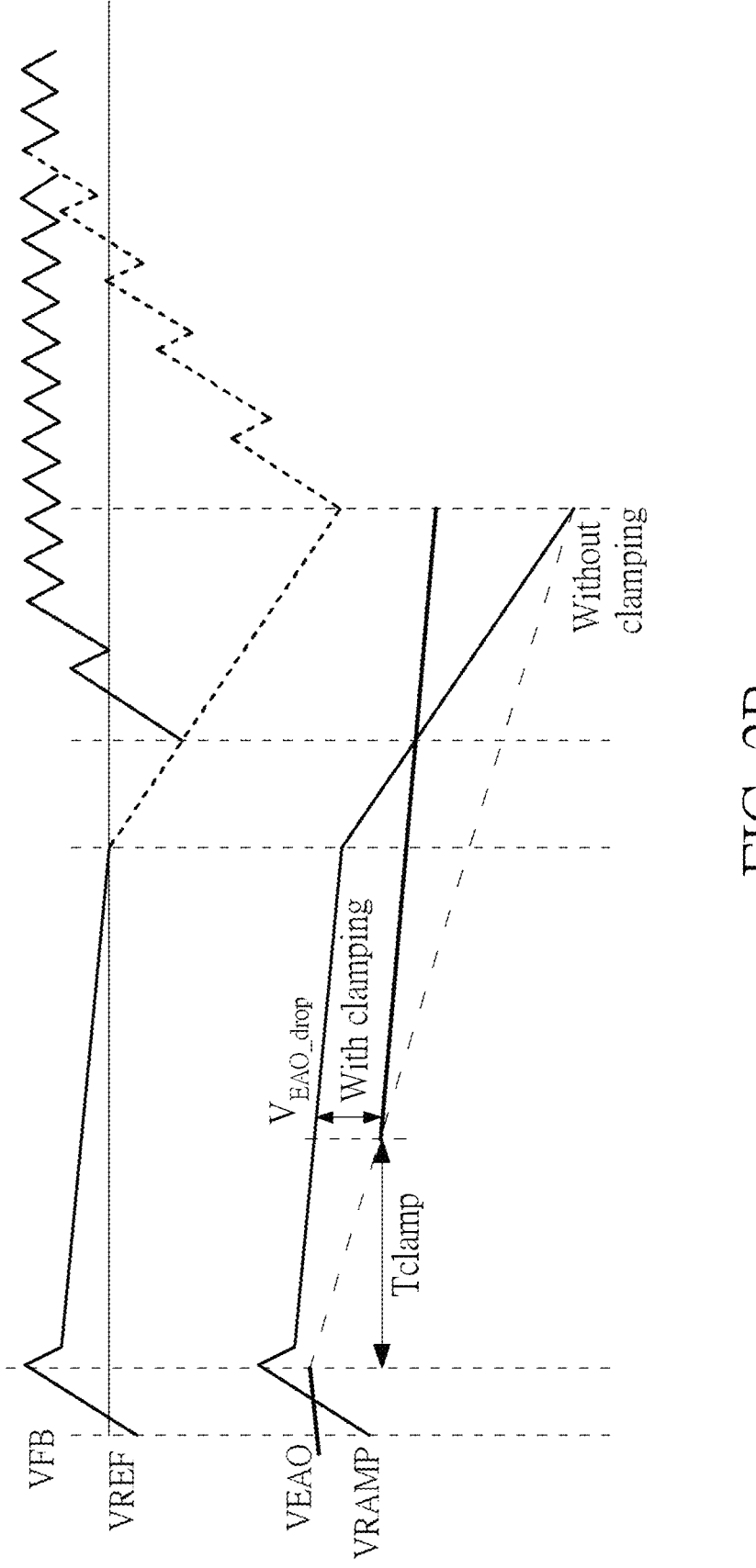

Please refer to both FIGS. 2A and 2B. FIGS. 2A and 2B depict a transition from standby mode to sleep mode in the buck converter 100. The transition from standby mode to sleep mode is determined by comparing the output voltage slew rate to the clamping speed of the error amplifier 132. This transition is governed by the following inequality:

Error amplifier with clamping:

$$I_{sink} \times R_{EAO} > V_{OS\_CMP}$$

$$G_m \times \Delta V_{out} \times R_{EAO} = G_m \times \frac{I_{LOAD}T_{CLAMP}}{C_{OUT}} \times R_{EAO} > V_{OS\_CMP}$$

$$T_{CLAMP} > \frac{V_{OS\_CMP}C_{OUT}}{G_m I_{LOAD}R_{EAO}}$$

Error amplifier without clamping:

$$T_{CLAMP} < \frac{C_{EAO}V_{EAO\_drop}}{I_{sink}}$$

To solve above problem, the clamping time should be:

$$\frac{C_{EAO}V_{EAO\_drop}}{I_{sink}} > T_{CLAMP} > \frac{V_{OS\_CMP}C_{out}}{G_m I_{LOAD}R_{EAO}}$$

$T_{CLAMP}$: the clamping time.
$V_{OS\_CMP}$: the comparator offset voltage.
$C_{OUT}$: the output capacitance.
$G_m$: the error amplifier transconductance.
$I_{LOAD}$: the load current.
$R_{EAO}$: the error amplifier output resistance.
$C_{EAO}$: the error amplifier output capacitance.
$V_{EAO\_drop}$: the voltage drop at the output of the error amplifier.
$I_{SINK}$: the sink current of the error amplifier.

Please note that the use of subscripts in the mathematical formulas (e.g., constants and variables) is solely for clarity and conveys the same meaning as the same symbols without subscripts in the present disclosure.

When this inequality is satisfied, the buck converter 100 enters sleep mode. In this state, the logic circuit 140 activates a clamping mechanism on the error amplifier 132 output. The clamping time $T_{CLAMP}$ is crucial and must be carefully chosen to balance power savings and transient response and should be less than $(C_{EAO} \times V_{EAO\_drop})/I_{SINK}$.

The reference voltage VREF and feedback voltage VFB are crucial in the control loop 130 of the buck converter 100, as illustrated in the FIG. 2B. The reference voltage VREF serves as the target voltage for the output regulation, while the feedback voltage VFB represents the scaled version of the actual output voltage VOUT. The error amplifier 132 continuously compares these two voltages. This comparison generates the error amplifier output voltage VEAO, which drives the control loop.

In normal operation, error amplifier output voltage VEAO fluctuates to maintain feedback voltage VFB as close to VREF as possible, ensuring stable output regulation. However, as the converter 100 transitions into sleep mode, the clamping mechanism activated by the logic circuit 140 limits the range of error amplifier output voltage VEAO. This clamping action is represented by the flattened error amplifier output voltage VEAO line in the "With clamping" graph. The clamping helps reduce unnecessary switching activity during light load conditions, thereby saving power. The relationship between reference voltage VREF, feedback voltage VFB, and the clamped error amplifier output voltage VEAO is critical in determining the sleep mode behavior and the converter's ability to maintain regulation while minimizing power consumption. The carefully tuned interaction of these voltages, along with the clamping time $T_{CLAMP}$, allows the buck converter 100 to achieve an optimal balance between power efficiency and transient response in sleep mode.

To illustrate the sleep mode entry conditions for the buck converter 100, considering a numerical example with the following parameters:

Output capacitance ($C_{OUT}$): 10 µF
Error amplifier output capacitance ($C_{EAO}$): 5 pF
Error amplifier output resistance ($R_{EAO}$): 8 MΩ
Error amplifier sink current ($I_{SINK}$): 10 nA
Error amplifier output voltage drop ($V_{EAO\_drop}$): 100 mV
Comparator offset voltage ($V_{OS\_CMP}$): 10 mV
Error amplifier transconductance ($G_m$): 1 nS
Load current ($I_{LOAD}$): 750 mA Applying these values to the sleep mode boundary equations, the clamping time ($T_{CLAMP}$) should satisfy the following condition: 50 µs>$T_{CLAMP}$>16.6 µs This range for $T_{CLAMP}$ ensures that the buck converter 100 can enter sleep mode efficiently while maintaining the ability to respond to load transients. The logic circuit 140 would use this $T_{CLAMP}$ window to implement the sleep mode transition, balancing power savings with transient response capabilities.

Figure 3:
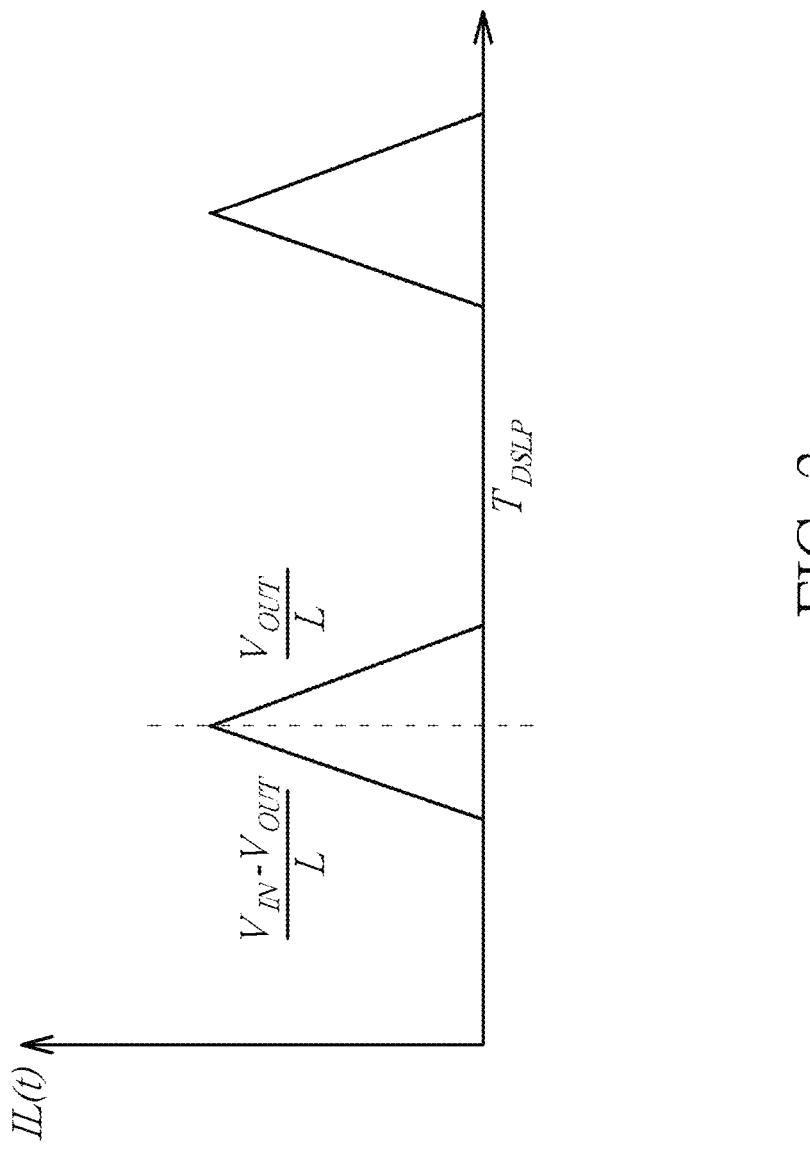
FIG. 3 depicts a transition from sleep mode to deep-sleep mode in the buck converter of FIG. 1.

FIG. 3 depicts a transition from sleep mode to deep-sleep mode in the buck converter 100. The transition from sleep mode to deep-sleep mode in the buck converter 100 is determined by analyzing the impact of the quiescent current (IQ) of the comparator 134 on overall efficiency of the buck converter 100. The deep-sleep mode boundary is defined by the following equation:

$$T_{DSLP} = \frac{C \Delta V_O}{I_{LOAD}}$$

$$\Delta V_O = \frac{(TD)^2}{2}\left(1 + \frac{V_{IN} - V_{OUT}}{V_{OUT}}\right) \times \frac{V_{IN} - V_{OUT}}{LC} =$$

$$\frac{T^2 D^2}{2LC} \times \left(V_{IN} - V_{OUT} + V_{IN}^2 - 2V_{IN}V_{OUT} + V_{OUT}^2\right)$$

$$\text{Ideal efficiency} = 100\% = \frac{V_{OUT} \times I_{LOAD}}{V_{IN} \times I_{IN}}$$

Assuming comparator IQ reduces overall efficiency by 1%

$$99\% < \frac{V_{OUT} \times I_{LOAD}}{V_{IN} \times (I_{IN} + I_{CMP})} = \frac{V_{OUT} \times I_{LOAD}}{V_{OUT} \times I_{LOAD} + V_{IN} \times I_{CMP}}$$

$$0.01 \times V_{OUT} \times I_{LOAD} = 0.99 \times V_{IN} \times I_{CMP}$$

8

-continued $$I_{LOAD} = \frac{99 \times V_{IN} \times I_{CMP}}{V_{OUT}}$$

$$T_{DSLP} = \frac{C \Delta V_O}{I_{LOAD}} = \frac{\frac{D^2}{2LF^2} \times V_{OUT} \times \left(\frac{1}{D} - 1\right)}{99 \times I_{CMP}}$$

$T_{DSLP}$: the deep-sleep mode boundary time
L: the inductance of the output inductor LOUT
ΔVO: the output voltage ripple
$I_{LOAD}$: the load current
C: the output capacitance COUT
D: the duty cycle
T: the switching period
F: the switching frequency
$V_{OUT}$: the output voltage
$V_{IN}$: the input voltage
$I_{CMP}$: the comparator current The above calculation illustrates that when the actual load current $I_{LOAD}$ falls below this calculated value ($I_{LOAD}$=(99× $V_{IN}$×$I_{CMP}$)/$V_{OUT}$), the buck converter 100 enters deep-sleep mode. In this state, the logic circuit 140 completely shuts down the comparator 134 to achieve ultra-low quiescent current operation. This transition occurs when the power saved by turning off the comparator 134 outweighs the potential impact on regulation, typically when the comparator's quiescent current would reduce overall efficiency by more than 1%.

To illustrate the deep-sleep mode entry conditions for the buck converter 100, considering a numerical example with the following parameters:

Duty cycle ($D$) = 0.5

Output voltage ($V_{OUT}$) = 1.8 V

Inductance ($L$) = 1 µH

Output capacitance ($C$) = 10 µF

Switching frequency ($F$) = 1.5 MHz

Comparator quiescent current ($I_{CMP}$) = 10 µA

The deep-sleep mode boundary time $T_{DSLP}$ can be obtained by:

$$T_{DSLP} = 0.1/(99 \times 10 \, \mu A) \approx 100 \, \mu s$$

These calculations demonstrate how the buck converter 100 dynamically adjusts its operation based on load conditions to achieve ultra-low quiescent current operation while maintaining adequate output voltage regulation.

The deep-sleep mode enables the buck converter 100 to achieve ultra-low power consumption under extremely light load conditions. This mode significantly extends battery life in portable applications by minimizing quiescent current draw. While operating in deep-sleep mode, the converter 100 maintains its ability to regulate the output voltage VOUT, though with decreased precision and increased response time t0 load transients. This trade-off between power efficiency and performance is carefully balanced to optimize overall system efficiency when the load current ILOAD is at its lowest levels, making it particularly beneficial for battery-powered devices that spend extended periods in standby or idle states.

Figure 4:
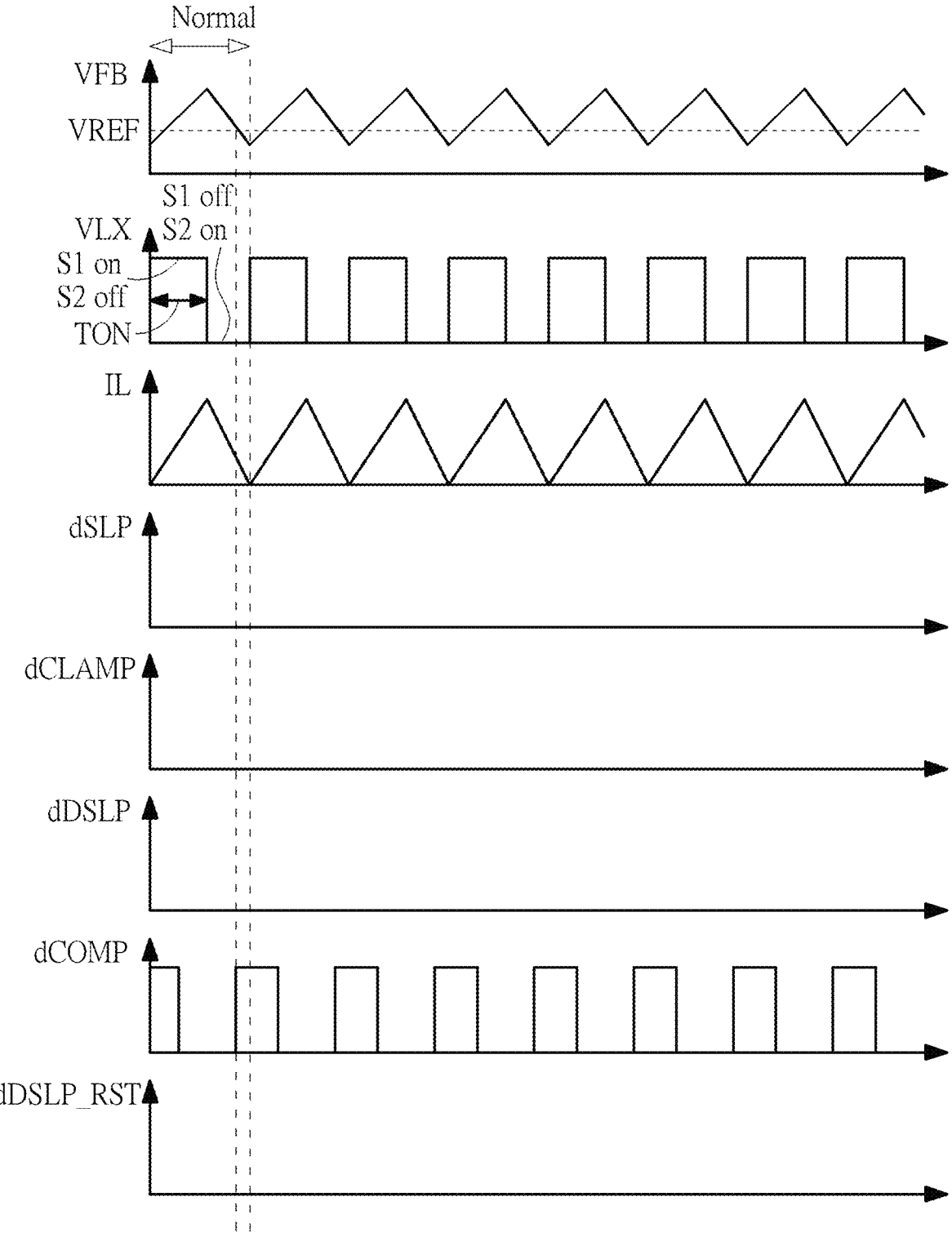
FIG. 4 depicts a timing diagram for the normal mode operation of buck converter of FIG. 1.

FIG. 4 depicts a timing diagram for the normal mode operation of buck converter 100. At the center of this operation is the CMP signal dCOMP, generated by the comparator 134. When the feedback voltage VFB falls below the reference voltage VREF, the comparator output dCOMP becomes high, triggering the first switch S1 to turn on. Simultaneously, the on-time signal TON (i.e., PWM signal), generated by the on-time generator 180, determines the duration for which the first switch S1 remains on during each switching cycle. The first switch S1 remains on for the duration of the on-time cycle of on-time signal. Concurrently, the comparator 134 compares the error amplifier output voltage VEAO with a ramp voltage VRAMP. The comparator 134 would signal to turn off S1 when the output voltage VOUT reaches a predetermined value. Both conditions (TON off and VOUT reaching the predetermined value) need to be satisfied simultaneously to turn off the first switch S1 and turn on the second switch S2.

A switching node voltage VLX represents the voltage at the switching node, which is the connection point between the first switch S1, the second switch S2, and the inductor LOUT. When the first switch S1 turned on, the switching node voltage VLX is pulled up to approximately the input voltage VIN. This causes the voltage across the inductor LOUT to be positive, resulting in an increasing inductor current IL. As soon as first switch S1 turns off and second switch S2 turns on, the switching node voltage VLX is pulled down to near ground potential. This reverses the voltage across the inductor, causing IL to decrease.

During normal mode operation, the logic circuit 140 uses the on-time signal TON in conjunction with dCOMP to precisely control the switching of the switches S1 and S2. The switching cycle of the switches S1 and S2 can be adjusted cycle-by-cycle based on the feedback from the error amplifier 132 and comparator 134, allowing the converter to respond quickly to changes in input voltage VIN or load current ILOAD.

During normal mode operation of the buck converter 100, the clamping signal dCLAMP, sleep mode signal dSLP, deep-sleep mode signal dDSLP, and deep-sleep mode reset signal dDSLP_RST remain inactive, as these signals are specifically associated with the converter's power-saving modes and are not required for standard voltage regulation under typical load conditions.

Throughout these switching cycles, the error amplifier output voltage VEAO plays a critical role in maintaining regulation. It continuously adjusts based on the feedback voltage VFB. The buck converter 100 ensures that the output voltage VOUT remains regulated despite fluctuations in the input voltage VIN or the load current ILOAD. The logic circuit 140 controls this entire process, ensuring precise timing and coordination of all signals based on the inputs from the error amplifier 132 and comparator 134. This sophisticated interworking of signals and components allows the buck converter 100 to maintain efficient and stable voltage regulation in normal mode operation.

Figure 5:
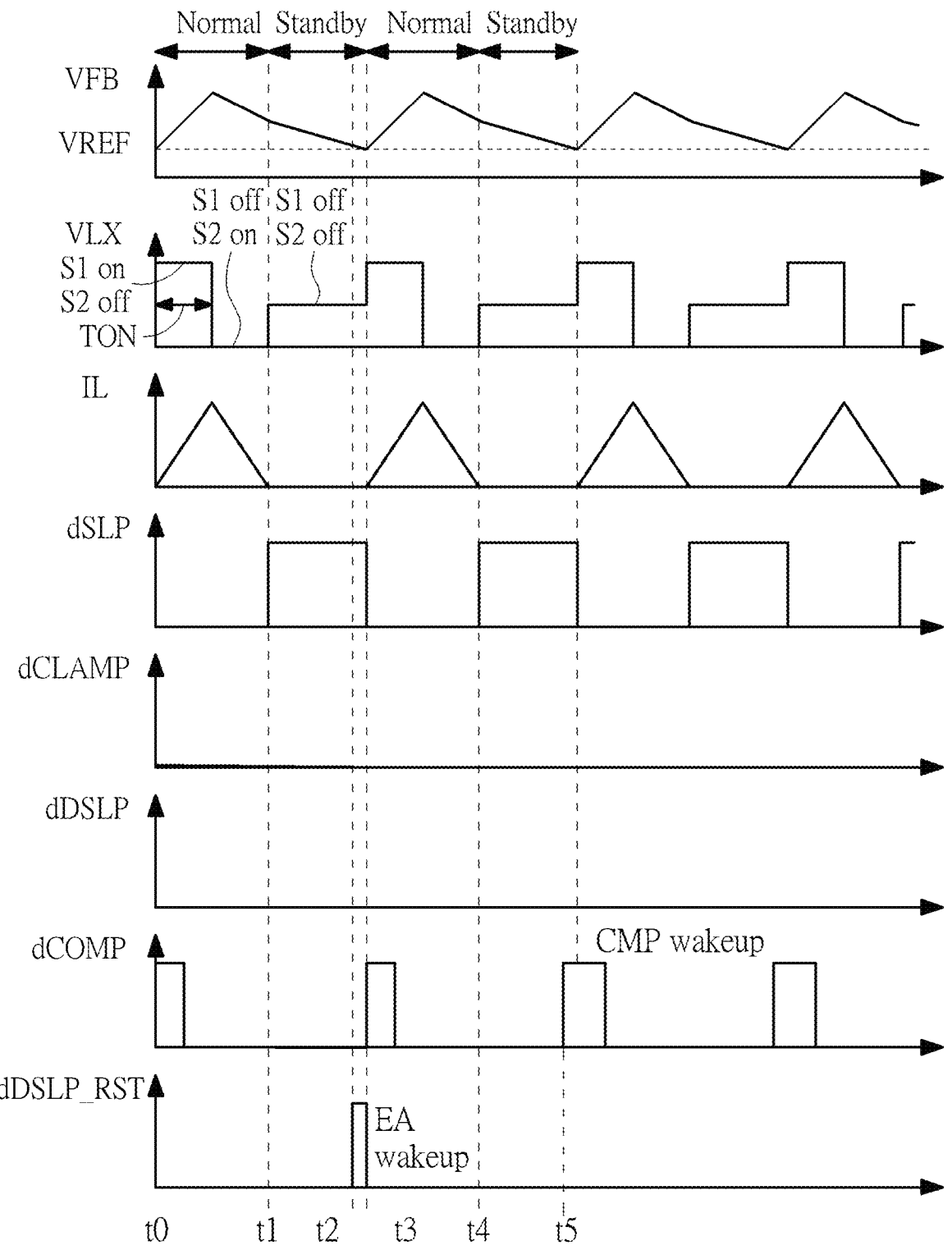
FIG. 5 depicts a timing diagram for transitioning between the normal mode and the standby mode in buck converter of FIG. 1.

FIG. 5 depicts a timing diagram for transitioning between the normal mode and the standby mode in buck converter 100. The standby mode is activated when the load current ILOAD decreases. In standby mode, the key signals exhibit distinct behavior.

At time t0, the buck converter 100 is operating in normal mode. The feedback voltage VFB is above the reference voltage VREF, indicating proper output voltage regulation.

Between time t0 to t1, the buck converter continues normal operation. The switching node voltage VLX alternates between high (when the first switch S1 is on) and low (when the second switch S2 is on) states. The inductor current IL forms a triangular waveform, indicating regular charging and discharging cycles. The comparator 134 output CMP signal dCOMP to trigger the first switch S1 turning on.

Between time t1 to t2, the inductor current IL drops to approximately zero or negative during normal operation, indicating a significant decrease in load current ILOAD. This triggers the buck converter 100 to enter standby mode, and consequently, both switches S1 and S2 turn off. At this time, the switching node voltage VLX stays at a midpoint, which can be close to the output voltage VOUT, and the inductor current IL remains zero or negative. The CMP signal dCOMP becomes low as switching is suspended.

Between time t2 to t3, the error amplifier 132 initiates a wake-up. The error amplifier 132 detects feedback voltage VFB falling below reference voltage VREF, and consequently, generates a deep-sleep mode reset signal dDSLP_RST (e.g., a pulse signal). This initiates a wake-up sequence. The buck converter 100 resumes normal operation, with switching node voltage VLX showing regular switching patterns, inductor current IL resuming its triangular waveform, and CMP signal dCOMP forming pulses again.

Between time t3 to t4, the inductor current IL forms a triangular wave again, causing feedback voltage VFB to rise above reference voltage VREF. The buck converter 100 operates in normal mode again.

Between time t4 to t5, the inductor current IL becomes approximately zero or negative, causing the feedback voltage VFB continue to drops until reaching the level of reference voltage VREF. The buck converter 100 enters the standby mode. The switching node voltage VLX stays at a midpoint, and CMP signal dCOMP becomes low.

At time t5, the comparator 134 initiates a wake-up. The comparator 134 detects feedback voltage VFB falling below reference voltage VREF and triggers a wake-up through the dCOMP signal. The buck converter 100 quickly resumes normal operation, with switching node voltage VLX showing switching patterns, inductor current IL resuming its triangular waveform, and CMP signal dCOMP resuming regular pulses. The subsequent operational sequence follows the same pattern as previously described, and therefore, for the sake of brevity, it will not be repeated herein.

Throughout this operating sequence, the clamping signal dCLAMP and the deep-sleep mode signal dDSLP remain inactive, as the buck converter 100 does not enter the sleep mode or the deep-sleep modes.

This standby mode allows the buck converter 100 to reduce its power consumption during periods of light load, while still maintaining the ability to quickly resume normal operation if the load current ILOAD increases. The logic circuit 140 continuously evaluates the converter's operating conditions, prepared to initiate a return to normal mode if the load current ILOAD increases, or to transition into sleep mode or deep-sleep mode if the load current ILOAD further decreases, ensuring optimal efficiency across varying load scenarios.

There are two cases where the buck converter 100 can return to normal mode. In the first case, the error amplifier 132 initiates the return to normal mode. When the feedback voltage VFB falls below the reference voltage VREF, the error amplifier 132 sends a deep-sleep mode reset signal dDSLP_RST pulse to the logic circuit 140 to initiate a wake-up sequence. Following the deep-sleep mode reset signal dDSLP_RST pulse, the on-time signal TON activates, causing the first switch S1 and second switch S2 to switching again. The CMP signal dCOMP forms a pulse, and the buck converter 100 returns to its normal switching cycle, quickly restoring the output voltage VOUT to its regulated level.

In the second case, the comparator 134 initiates the return to normal mode. As the feedback voltage VFB declines, it eventually falls below the reference voltage VREF. When this occurs, the comparator 134 outputs the CMP signal dCOMP, which causes the logic circuit 140 to immediately activate TON, turning on the first switch S1. The switching node voltage VLX is pulled high, and the inductor current IL begins to increase. The CMP signal dCOMP forms a pulse, bringing the converter 100 back to its normal operating mode.

By implementing both wake-up methods concurrently, the buck converter 100 achieves a seamless wake-up operation. This combination ensures that the converter can handle a wide range of load transient scenarios efficiently, maintaining tight output voltage VOUT regulation while optimizing power consumption. The logic circuit 140 coordinates these wake-up methods, selecting the appropriate response based on the specific conditions detected, thereby enhancing the overall performance and reliability of the buck converter 100.

Figure 6:
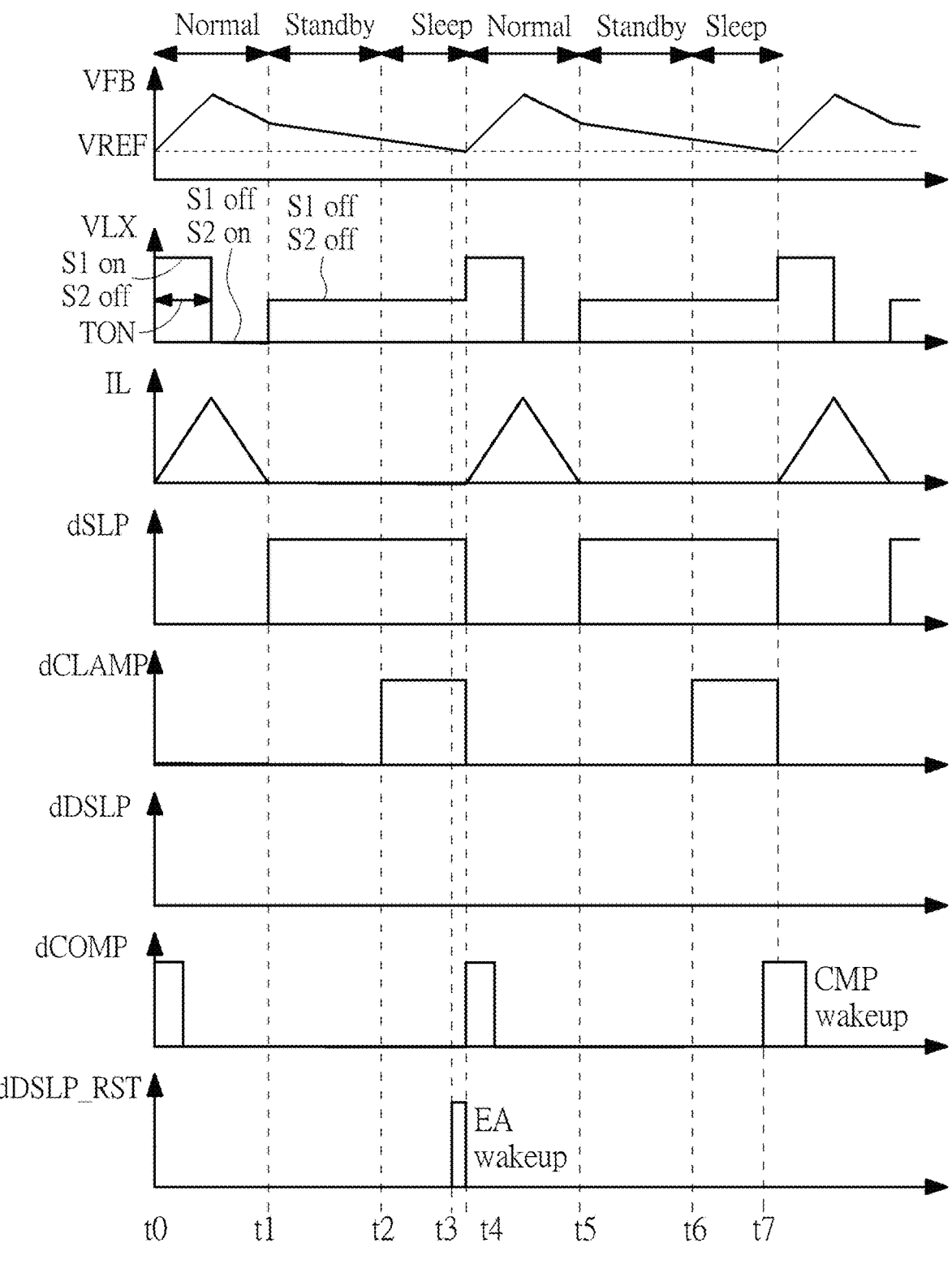
FIG. 6 depicts a timing diagram for sleep mode operation and its transition in the buck converter of FIG. 1.

FIG. 6 depicts a timing diagram for sleep mode operation and its transition in the buck converter 100. In this mode, the converter operates with reduced switching frequency and employs additional power-saving techniques.

At time to, the buck converter 100 is operating in normal mode. The feedback voltage VFB is above the reference voltage VREF, indicating proper output voltage regulation.

Between time t0 to t1, the buck converter continues normal operation. The switching node voltage VLX alternates between high (when the first switch S1 is on) and low (when the second switch S2 is on) states. The inductor current IL forms a triangular waveform, indicating regular charging and discharging cycles. The comparator 134 output CMP signal dCOMP to trigger the first switch S1 turning on.

Between time t1 to t2, the inductor current IL drops to approximately zero or negative during normal operation, indicating a significant decrease in load current ILOAD. This triggers the buck converter 100 to enter standby mode, and consequently, both switches S1 and S2 turn off. The switching node voltage VLX stays at a midpoint, and the inductor current IL remains zero or negative. The CMP signal dCOMP becomes low as switching is suspended. The feedback voltage VFB may decay slowly.

Between time t2 to t3, the buck converter 100 transitions from standby to sleep mode as the load current ILOAD further decreases. The clamping signal dCLAMP activates, clamping the error amplifier output voltage VEAO to save power. Additionally, the current generated by the current source 136 can be reduced from μA to nA level.

Between time t3 to t4, the error amplifier 132 initiates a wake-up. The error amplifier 132 detects the feedback voltage VFB falling below the reference voltage VFB, and consequently, triggers the deep-sleep mode reset signal dDSLP_RST. This initiates the wake-up sequence. The buck converter 100 can resume normal operation, that is, the switching node voltage VLX shows switching patterns, the inductor current IL resumes its triangular waveform, and the CMP signal dCOMP forms pulses. The sleep mode signal dSLP and clamping signal dCLAMP deactivate.

Between time t4 to t5, the load current ILOAD increase again, causing feedback voltage VFB to rise above reference voltage VREF. The buck converter 100 operates in normal mode again. Note that the current generated by the current source 136 can be increased back to μA level.

Between time t5 to t6, the inductor current IL drops to approximately zero or negative during normal operation. The buck converter 100 enters standby mode. The switching node voltage VLX stays at a midpoint, and the CMP signal dCOMP becomes low. The feedback voltage VFB may decrease slowly.

Between time t6 to t7, the buck converter 100 transitions to sleep mode again. The clamping signal dCLAMP activates, clamping the error amplifier output voltage VEAO.

At time t7, the comparator 134 of the buck converter 100 initiates a wake-up sequence upon detecting that the feedback voltage VFB has fallen below the reference voltage VREF. This detection triggers the CMP signal dCOMP, prompting the converter to resume normal operation. Consequently, the switching node voltage VLX begins to exhibit its characteristic switching patterns, while the inductor current IL returns to its regular waveform. The comparator output dCOMP forms a pulse. Simultaneously, the sleep mode signal dSLP and the clamping signal dCLAMP deactivate, fully transitioning the converter out of its power-saving state and back into its normal mode of operation.

The subsequent operational sequence follows the same pattern as previously described, and therefore, for the sake of brevity, it will not be repeated herein.

Throughout this sequence, the deep-sleep mode signal dDSLP remains inactive as the buck converter 100 does not enter deep-sleep mode. The transitions between normal, standby, and sleep modes are controlled by the logic circuit 140 based on the detected load current ILOAD conditions and feedback voltage VFB levels.

Similar to the previous embodiment, there are two cases for returning to normal mode illustrated in FIG. 6. In first case, the error amplifier 132 initiates the return to normal mode. When the feedback voltage VFB falls below the reference voltage VREF, the error amplifier 132 sends a deep-sleep mode reset signal dDSLP_RST pulse to the logic circuit 140 to initiate a wake-up sequence. Following the deep-sleep mode reset signal dDSLP_RST pulse, the on-time signal TON activates, causing the first switch S1 and second switch S2 to switching again. The CMP signal dCOMP resumes its switching pattern, and the buck converter 100 returns to its normal switching cycle, quickly restoring the output voltage VOUT to its regulated level.

The logic circuit 140 deactivates the clamping signal dCLAMP by setting the clamp enable signal EN CLAMP low, allowing the error amplifier output voltage VEAO to rise further. Simultaneously, it sets the comparator enable signal EN CMP high to enable the comparator 134. This action triggers the resumption of normal switching operation. Upon this trigger, the on-time signal TON resumes its regular pattern, causing the first switch S1 to close at the normal switching frequency. The buck converter 100 exits the sleep mode and returns to normal mode, quickly restoring the output voltage VOUT to its regulated level.

In the second case, the comparator 134 initiates the return to normal mode. When the feedback voltage VFB falls below the reference voltage VREF, the comparator 134 sends a CMP signal dCOMP pulse to the logic circuit 140 to initiate a wake-up sequence. The logic circuit 140 responds to this CMP signal dCOMP trigger by immediately setting the clamp enable signal EN CLAMP low to deactivate the clamping, and resuming normal on-time signal TON operation. This operation causes the first switch S1 to resume normal switching, pulling the switching node voltage VLX high at the regular switching frequency. The inductor current IL begins to increase rapidly, and the CMP signal dCOMP resumes its normal pattern.

Figure 7:
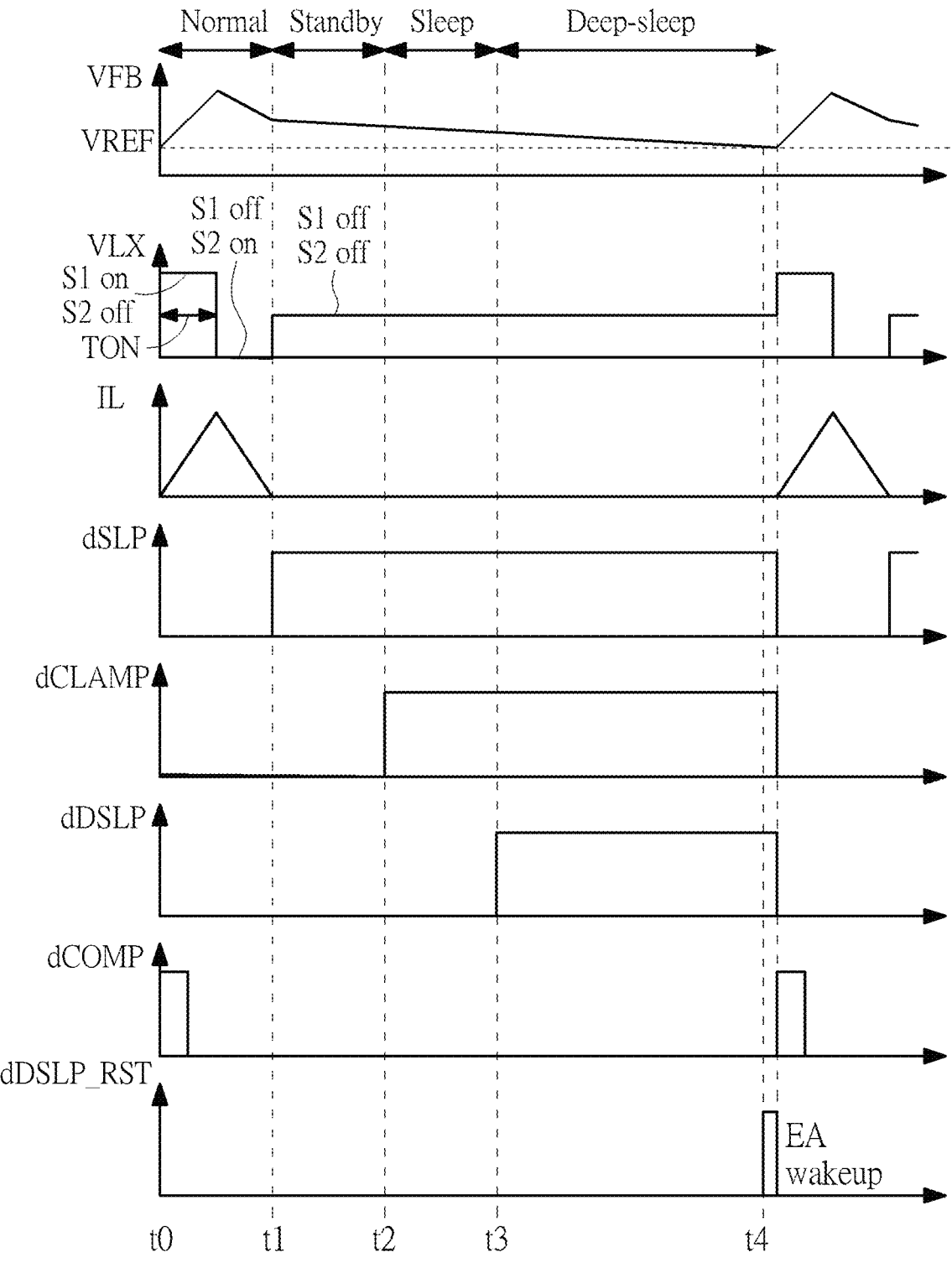
FIG. 7 depicts a timing diagram for deep-sleep mode operation and its transition in the buck converter of FIG. 1.

FIG. 7 depicts a timing diagram for deep-sleep mode operation and its transition in the buck converter 100. In this mode, the comparator 134 is deactivated, and consequently, the buck converter 100 can obtain additional power-saving. The comparator 134 is deactivated when its quiescent current approaches zero. This condition can be achieved through various methods, such as cutting off current source 136. However, other techniques may also be employed to reduce the quiescent current to zero, as the invention is not limited to a specific method.

At time to, the buck converter 100 is operating in normal mode. The feedback voltage VFB is above the reference voltage VREF, indicating proper output voltage regulation.

Between time t0 to t1, the buck converter continues normal operation. The switching node voltage VLX alternates between high (when the first switch S1 is on) and low (when the second switch S2 is on) states. The inductor current IL forms a triangular waveform, indicating regular charging and discharging cycles. The comparator 134 output CMP signal dCOMP to trigger the first switch S1 turning on.

Between time t1 to t2, the inductor current IL drops to approximately zero or negative during normal operation, indicating a significant decrease in load current ILOAD. This triggers the buck converter 100 to enter standby mode, and consequently, both switches S1 and S2 turn off. The switching node voltage VLX stays at a midpoint, and the inductor current IL remains zero or negative. The CMP signal dCOMP becomes low as switching is suspended. The feedback voltage VFB may decrease slowly.

Between time t2 to t3, the buck converter 100 transitions from standby to sleep mode as the load current ILOAD further decreases. The clamping signal dCLAMP activates, clamping the error amplifier output voltage VEAO to save power. Additionally, the current generated by the current source 136 can be reduced from μA to nA level.

Between time t3 to t4, as the load current ILOAD reaches an even lower level, the buck converter 100 enters deep-sleep mode. The deep-sleep mode signal dDSLP activates, disabling the comparator 134 to minimize power consumption. The feedback voltage VFB continues its slow decay. At this time, the buck converter 100 achieves ultra-low quiescent current in the nanoampere (nA) range by clamping the error amplifier output voltage and strategically shutting down the comparator during deep-sleep mode, thereby significantly extending battery life in portable applications.

At time t4, the error amplifier 132 initiates a wake-up sequence. It detects the feedback voltage VFB falling below the reference voltage, and consequently, triggers the deep-sleep mode reset signal dDSLP_RST. This triggers a cascade of events: the deep-sleep mode signal dDSLP deactivates, re-enabling previously shut down circuits; the clamping signal dCLAMP deactivates, removing the clamp on the error amplifier output voltage VEAO; and the sleep mode signal dSLP deactivates, allowing switching to resume. Consequently, the CMP signal dCOMP forms a pulse, initiating the switching cycle. The switching node voltage VLX begins its characteristic switching pattern, while the inductor current IL through LOUT resumes its triangular waveform. As a result of these actions, the feedback voltage VFB starts to rise, indicating that the output voltage VOUT is being actively regulated again. This synchronized sequence of events demonstrates efficient transition of the buck converter 100 from its lowest power state back to normal operation mode.

The subsequent operational sequence follows the same pattern as previously described, and therefore, for the sake of brevity, it will not be repeated herein.

The specific criteria for entering each operating mode have been previously detailed, and the embodiments illustrated in the timing diagrams adhere to these established criteria.

Figure 8:
FIGS. 8 to 9 are flowcharts illustrate a method of operating the buck converter of FIG. 1 according to the embodiments.
Figure 8:
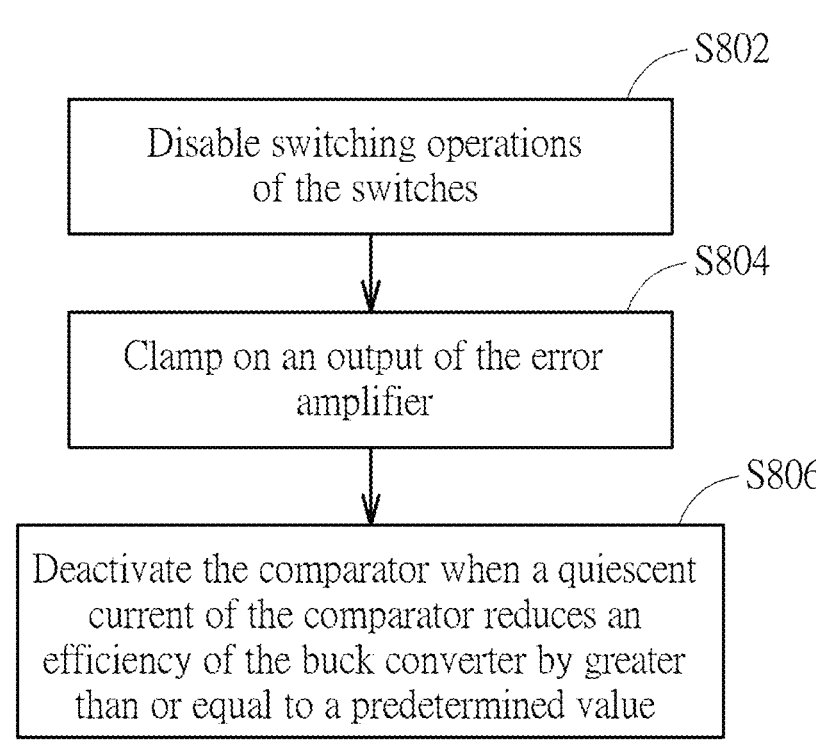

FIG. 8 is a flowchart illustrates a method 800 of operating the buck converter 100 according to the embodiments. The method includes the following steps:

S802: Disable switching operations of the switch S1 and the switch S2;

S804: Clamp on an output of the error amplifier 132; and

Figure 9:
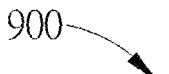
Figure 9:
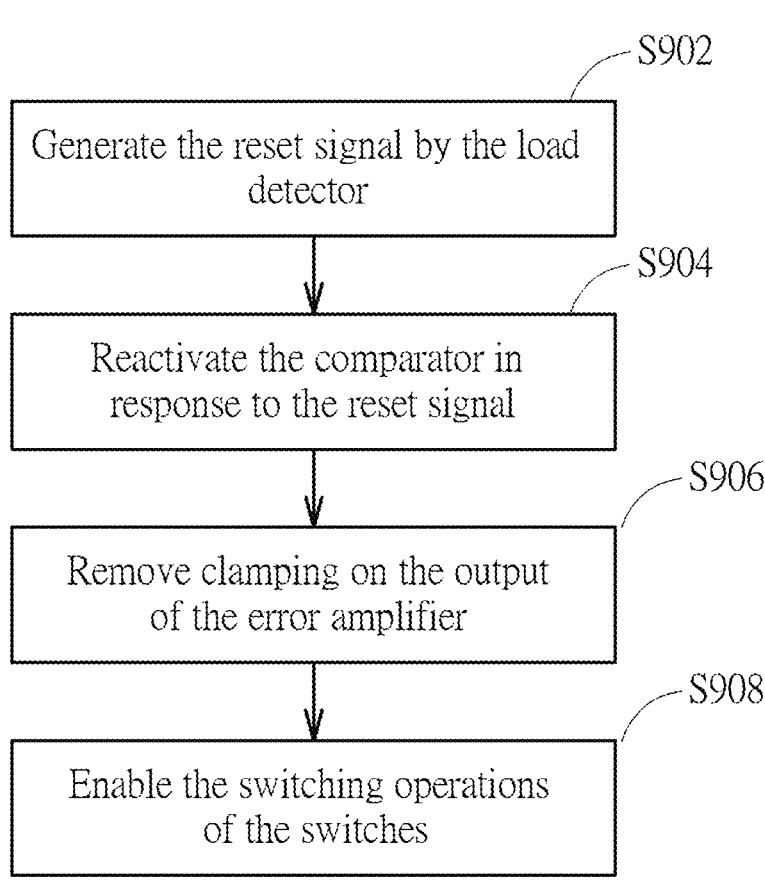

S806: Deactivate the comparator 134 when a quiescent current of the comparator reduces an efficiency of the buck converter 100 by greater than or equal to a predetermined value;

FIG. 9 is a flowchart illustrates a method 900 of operating the buck converter 100 according to the embodiments. The method includes the following steps:

S902: Generate the reset signal dDSLP by the load detector 160;

S904: Reactivate the comparator 134 in response to the reset signal dDSLP;

S906: Remove clamping on the output of the error amplifier 132; and

S908: Enable the switching operations of the switch S1 and the switch S2.

The embodiment of the disclosed buck converter with its control scheme offers several significant advantages over prior art. Firstly, the implementation of four distinct operational modes-normal, standby, sleep, and deep-sleep-allows for a more granular and adaptive approach to power management. Unlike conventional converters that typically offer only two or three modes, this system enables the buck converter 100 to precisely tailor its power consumption to the load conditions. This results in optimized efficiency across a wider range of load currents, particularly at very light loads where traditional converters often struggle to maintain high efficiency.

In addition, the novel approach of using both the error amplifier and comparator for wake-up detection provides a robust and responsive system for transitioning out of low-power modes. This dual wake-up mechanism ensures that the buck converter 100 can maintain tight output voltage VOUT regulation under various transient conditions, a feature not commonly found in traditional designs.

Furthermore, the incorporation of the clamping signal dCLAMP and deep-sleep mode signal dDSLP allows for more aggressive power saving in the lowest power modes. The buck converter achieves ultra-low quiescent current in the nanoampere (nA) range by clamping the error amplifier output voltage and strategically shutting down additional circuit blocks, such as the comparator, during deep-sleep mode, thereby significantly extending battery life in portable applications. This level of power optimization is often not achievable in simpler low-power converter designs.

Lastly, the sophisticated control logic implemented in the logic circuit enables seamless transitions between all four modes. This allows the buck converter to dynamically adapt to changing load conditions without compromising output voltage regulation or inducing significant transients. The ability to smoothly glide between power-saving modes and full-power operation represents a significant improvement over step-wise efficiency curves seen in many existing converters.

The terminology employed in the description of the various embodiments herein is intended for the purpose of describing particular embodiments and should not be construed as limiting. In the context of this description and the appended claims, the singular forms "a", "an", and "the" are intended to encompass plural forms as well, unless the context clearly indicates otherwise.

It should be understood that the term "and/or" as used herein is intended to encompass any and all possible combinations of one or more of the associated listed items. Furthermore, it should be noted that the terms "includes," "including," "comprises," and/or "comprising," when used in this specification, indicate the presence of stated features, integers, steps, operations, elements, and/or components, but do not exclude the presence or addition of one or more other features, integers, steps, operations, elements, components, and/or groups thereof.

In the context of this disclosure, the terms "coupled," "connected," "connecting," "electrically connected," and similar expressions are used interchangeably to broadly denote the state of being electrically or electronically connected. Furthermore, an entity is deemed to be in "communication" with another entity (or entities) when it electrically transmits and/or receives information signals to/from the other entity, irrespective of whether these signals contain voice information or non-voice data/control information, and regardless of the signal type (analog or digital). It is important to note that this communication can occur through either wired or wireless means. The use of these terms is intended to encompass all forms of electrical or electronic connectivity relevant to the described embodiments.

The directional terms used in the embodiments such as up, down, left, right, upper-side, down-side, in front of or behind are just the directions referring to the attached figures. Thus, the direction terms used in the present disclosure are for illustration, and are not intended to limit the scope of the present disclosure. It should be noted that the elements which are specifically described or labeled may exist in various forms for those skilled in the art.

This interpretation of terminology is provided to ensure clarity and consistency throughout the specification and claims, and should not be construed as restricting the scope of the disclosed embodiments or the appended claims.

The various illustrative components, logic, logical blocks, modules, circuits, operations and algorithm processes described in connection with the embodiments disclosed herein may be implemented as electronic hardware, firmware, software, or combinations of hardware, firmware or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

The hardware and data processing apparatus utilized to implement the various illustrative components, logics, logical blocks, modules, and circuits described herein may comprise, without limitation, one or more of the following: a general-purpose single-chip or multi-chip processor, a digital signal processor (DSP), an application specific integrated circuit (ASIC), a field programmable gate array (FPGA), other programmable logic devices (PLDs), discrete gate or transistor logic, discrete hardware components, or any suitable combination thereof. Such hardware and apparatus shall be configured to perform the functions described herein.

A general-purpose processor may include, but is not limited to, a microprocessor, or alternatively, any conventional processor, controller, microcontroller, or state machine. In certain implementations, a processor may be realized as a combination of computing devices. Such combinations may include, for example, a DSP and a microprocessor, a plurality of microprocessors, one or more microprocessors in conjunction with a DSP core, or any other such configuration as may be suitable for the intended application.

It is to be understood that in some embodiments, particular processes, operations, or methods may be executed by circuitry specifically designed for a given function. Such function-specific circuitry may be optimized to enhance performance, efficiency, or other relevant metrics for the particular task at hand. The selection of specific hardware implementation shall be determined based on the particular requirements of the application, which may include, inter alia, performance specifications, power consumption constraints, cost considerations, and size limitations.

In certain aspects, the subject matter described herein may be implemented as software. Specifically, various functions of the disclosed components, or steps of the methods, operations, processes, or algorithms described herein, may be realized as one or more modules within one or more computer programs. These computer programs may comprise non-transitory processor-executable or computer-executable instructions, encoded on one or more tangible processor-readable or computer-readable storage media. Such instructions are configured for execution by, or to control the operation of, data processing apparatus, including the components of the devices described herein. The aforementioned storage media may include, but are not limited to, RAM, ROM, EEPROM, CD-ROM or other optical disk storage, magnetic disk storage or other magnetic storage devices, or any other medium capable of storing program code in the form of instructions or data structures. It should be understood that combinations of the above-mentioned storage media are also contemplated within the scope of computer-readable storage media for the purposes of this disclosure.

Various modifications to the embodiments described in this disclosure may be readily apparent to persons having ordinary skill in the art, and the generic principles defined herein may be applied to other embodiments without departing from the spirit or scope of this disclosure. Thus, the claims are not intended to be limited to the embodiments shown herein, but are to be accorded the widest scope consistent with this disclosure, the principles and the novel features disclosed herein.

In certain implementations, the embodiments may comprise the disclosed features and may optionally include additional features not explicitly described herein. Conversely, alternative implementations may be characterized by the substantial or complete absence of non-disclosed elements. For the avoidance of doubt, it should be understood that in some embodiments, non-disclosed elements may be intentionally omitted, either partially or entirely, without departing from the scope of the invention. Such omissions of non-disclosed elements shall not be construed as limiting the breadth of the claimed subject matter, provided that the explicitly disclosed features are present in the embodiment.

Additionally, various features that are described in this specification in the context of separate embodiments also can be implemented in combination in a single implementation. Conversely, various features that are described in the context of a single implementation also can be implemented in multiple embodiments separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

The depiction of operations in a particular sequence in the drawings should not be construed as a requirement for strict adherence to that order in practice, nor should it imply that all illustrated operations must be performed to achieve the desired results. The schematic flow diagrams may represent example processes, but it should be understood that additional, unillustrated operations may be incorporated at various points within the depicted sequence. Such additional operations may occur before, after, simultaneously with, or between any of the illustrated operations.

Additionally, it should be understood that the various figures and component diagrams presented and discussed within this document are provided for illustrative purposes only and are not drawn to scale. These visual representations are intended to facilitate understanding of the described embodiments and should not be construed as precise technical drawings or limiting the scope of the invention to the specific arrangements depicted.

In certain implementations, multitasking and parallel processing may prove advantageous. Furthermore, while various system components are described as separate entities in some embodiments, this separation should not be interpreted as mandatory for all embodiments. It is contemplated that the described program components and systems may be integrated into a single software package or distributed across multiple software packages, as dictated by the specific implementation requirements.

It should be noted that other embodiments, beyond those explicitly described, fall within the scope of the appended claims. The actions specified in the claims may, in some instances, be performed in an order different from that in which they are presented, while still achieving the desired outcomes. This flexibility in execution order is an inherent aspect of the claimed processes and should be considered within the scope of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A buck converter comprising:
a power stage comprising:
   an input terminal for receiving an input voltage; and
   an output terminal for outputting an output voltage;
a feedback network coupled to the power stage, configured to generate a feedback voltage according to the output voltage;
a control loop comprising:
   an error amplifier (EA) configured to generate an EA voltage by comparing a reference voltage to the feedback voltage; and a comparator (CMP) coupled to the error amplifier, configured to generate a CMP signal according the EA voltage;
a logic circuit coupled to the control loop, configured to generate a logic control signal for implementing a control scheme according to a set of control signals;
a driver circuit coupled between the logic circuit and the power stage, configured to drive the power stage according to the logic control signal; and
a load detection circuit configured to provide a subset of control signals within the set of control signals to the logic circuit for mode switching in the control scheme according to an output current.

2. The buck converter of claim 1, further comprising:
an on-time generator coupled to the logic circuit, configured to generate a first control signal within the set of control signals; and
a zero current detector coupled to the logic circuit, configured to generate a second control signal within the set of control signals.

3. The buck converter of claim 1, wherein the comparator is deactivated when a quiescent current of the comparator reduces overall efficiency of the buck converter below a predetermined threshold.

4. The buck converter of claim 1, wherein the power stage further comprises:
a first switch and a second switch coupled in series forming a half bridge configuration between the input terminal and a ground;
an output inductor coupled between a switching node of the first switch and the second switch and the output terminal; and
an output capacitor coupled between the output terminal and the ground.

5. The buck converter of claim 4, wherein:
the first switch comprises:
   a first terminal coupled to the input terminal;
   a second terminal coupled to the switching node; and
   a control terminal coupled to the driver circuit; and
the second switch comprises:
   a first terminal coupled to the switching node;
   a second terminal coupled to the ground; and
   a control terminal coupled to the driver circuit.

6. The buck converter of claim 1, wherein the feedback network comprises:
a resistive divider coupled between the output terminal and a ground; and
a feed forward capacitor to the output terminal, the resistive divider and the error amplifier.

7. The buck converter of claim 1, wherein the control loop further comprises:
a resistor-capacitor (RC) circuit coupled between the error amplifier and a ground;
a current source coupled to the comparator; and
a clamp switch comprising:
   a first terminal coupled to the RC circuit;
   a second terminal coupled to the comparator; and
   a control terminal coupled to the logic circuit.

8. The buck converter of claim 7, wherein the error amplifier comprises:
a non-inverting terminal for receiving the reference voltage;
an inverting terminal coupled to the feedback network;
a first output terminal; and
a second output terminal coupled to the logic circuit.

9. The buck converter of claim 8, wherein the comparator comprises:

a non-inverting terminal coupled to the first output terminal of the error amplifier;

an inverting terminal coupled to the second terminal of the clamp switch;

a power terminal coupled to the current source;

a signal terminal coupled to the logic circuit; and an output terminal coupled to the logic circuit.

10. The buck converter of claim 7, wherein the control scheme comprises a normal mode, a standby mode, a sleep mode and a deep-sleep mode.

11. The buck converter of claim 10, wherein the standby mode is implemented by disabling the first switch and the second switch.

12. The buck converter of claim 10, wherein the sleep mode is implemented by clamping an output voltage of the error amplifier.

13. The buck converter of claim 12, wherein the sleep mode is further implemented by reducing a current generated by the current source from microampere to nanoampere level.

14. The buck converter of claim 10, wherein the deep sleep mode is implemented by disabling the comparator.

15. The buck converter of claim 1, further comprising a load coupled between the output terminal and a ground.

16. A method of operating a buck converter, comprising:

operating the buck converter with clamping on an output of an error amplifier, the output of the error amplifier being coupled to a comparator; and deactivating the comparator of the buck converter when a quiescent current of the comparator reduces an efficiency of the buck converter by greater than or equal to a predetermined value.

17. The method of claim 16, further comprising:

after deactivating the comparator of the buck converter and in response to a reset signal:

reactivating the comparator in response to the reset signal; and removing clamping on the output of the error amplifier.

18. The method of claim 16, further comprising:

disabling switching operations of a high-side switch and a low-side switch in the buck converter before clamping on the output of the error amplifier.

19. The method of claim 18, further comprising:

after deactivating the comparator of the buck converter and in response to a reset signal:

reactivating the comparator in response to the reset signal;

removing clamping on the output of the error amplifier; and enabling the switching operations of the high-side switch and the low-side switch in the buck converter.

20. The method of claim 19, further comprising increasing a current received by the comparator from nanoampere to microampere level.

* * * * *